US011619671B2

(12) United States Patent
Hayasaki

(10) Patent No.: US 11,619,671 B2
(45) Date of Patent: Apr. 4, 2023

(54) ELECTRONIC APPARATUS AND CONTROL METHOD

(71) Applicant: CANON KABUSHIKI KAISHA, Tokyo (JP)

(72) Inventor: Hiromi Hayasaki, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 80 days.

(21) Appl. No.: 17/149,122

(22) Filed: Jan. 14, 2021

(65) Prior Publication Data

US 2021/0223319 A1 Jul. 22, 2021

(30) Foreign Application Priority Data

Jan. 21, 2020 (JP) .............................. JP2020-007618

(51) Int. Cl.
*G06F 11/30* (2006.01)
*G01R 31/36* (2020.01)

(52) U.S. Cl.
CPC ..... *G01R 31/3648* (2013.01); *G01R 31/3646* (2019.01)

(58) Field of Classification Search
CPC .................................................. G01R 31/3648
See application file for complete search history.

(56) References Cited

U.S. PATENT DOCUMENTS 5,717,308 A * 2/1998 Nishitani .............. H02J 7/0047
396/301
2020/0077699 A1 3/2020 Bagai et al.

FOREIGN PATENT DOCUMENTS

JP H09113951 A 5/1997
JP 200944895 * 2/2009
JP 5717308 B2 7/2014

* cited by examiner

*Primary Examiner* — Phuong Huynh
(74) *Attorney, Agent, or Firm* — Canon U.S.A., Inc. IP Division

(57) ABSTRACT

An electronic apparatus includes a connection unit to which a battery device is connected, a calculation unit that calculates a remaining battery level of a battery of the battery device based on a full charge capacity of a battery of the electronic apparatus, and a display unit that displays information indicating a result of calculation made by the calculation unit.

17 Claims, 10 Drawing Sheets

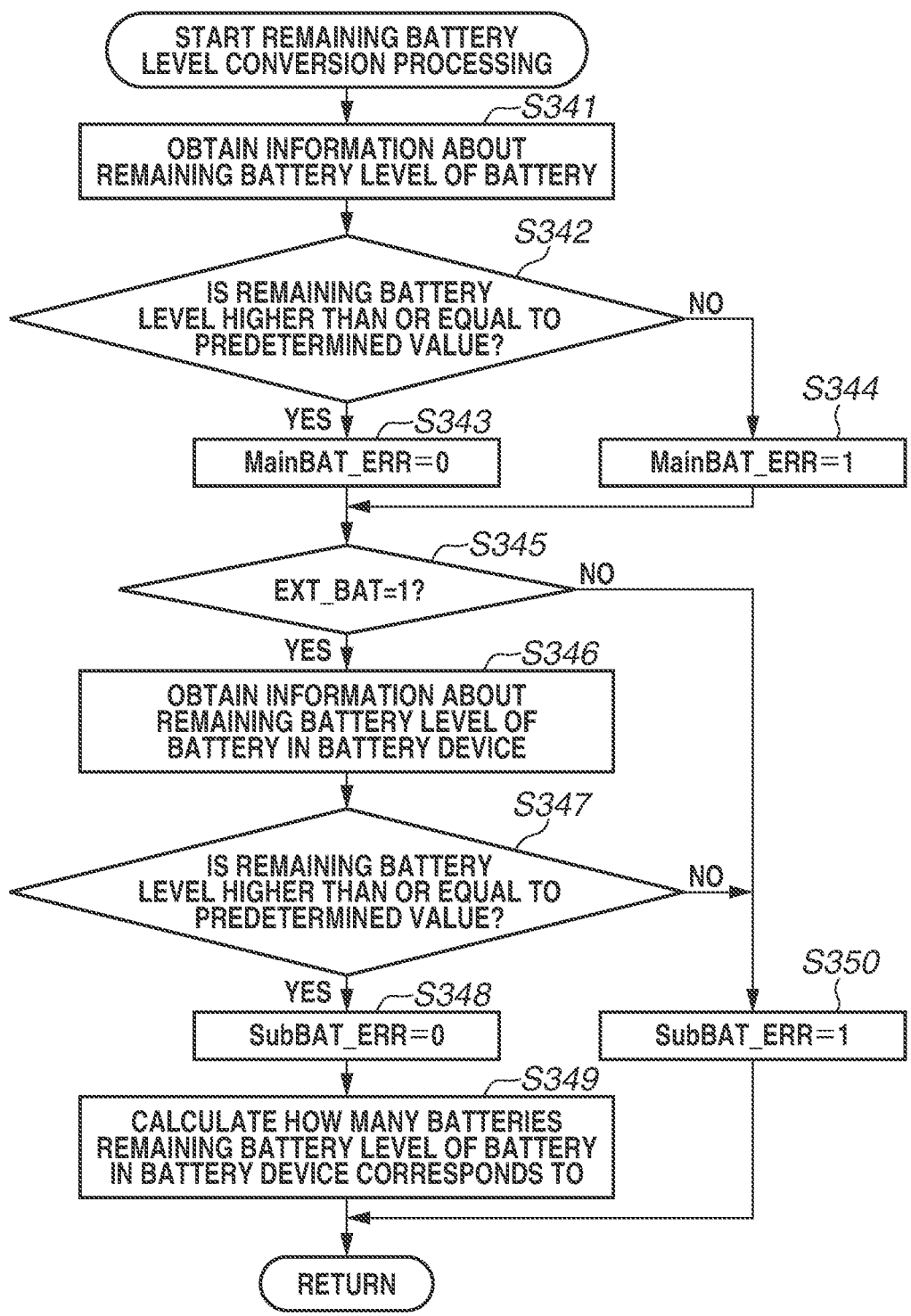

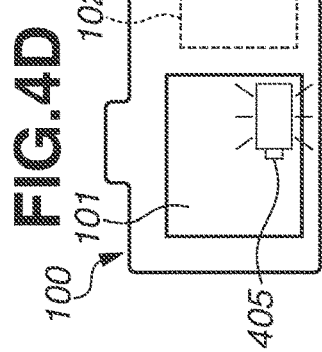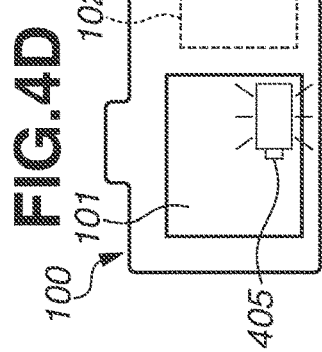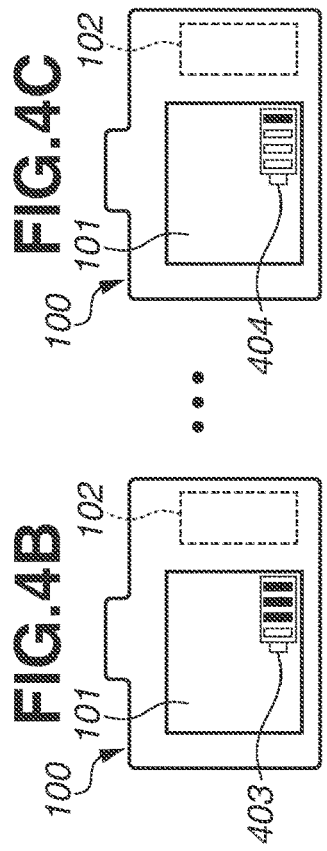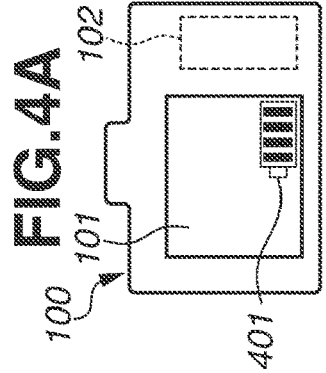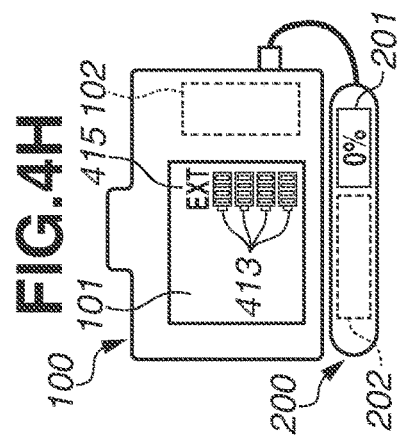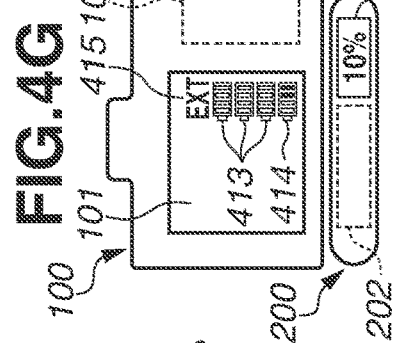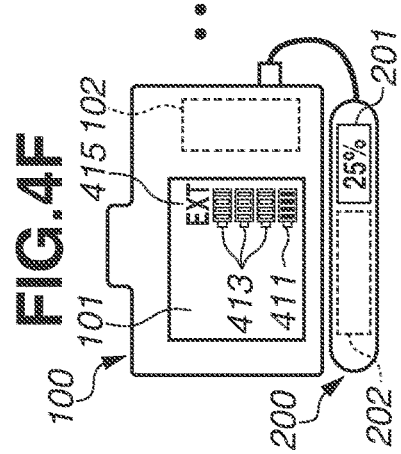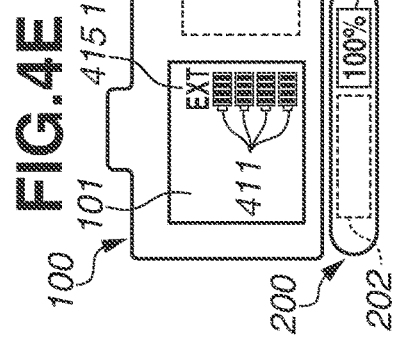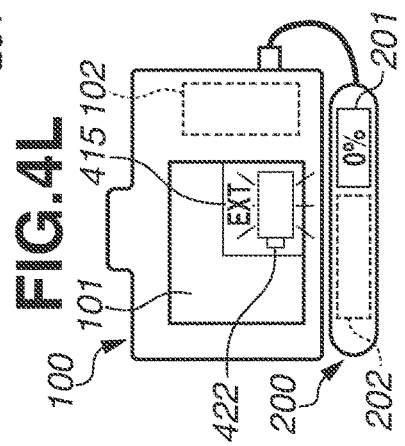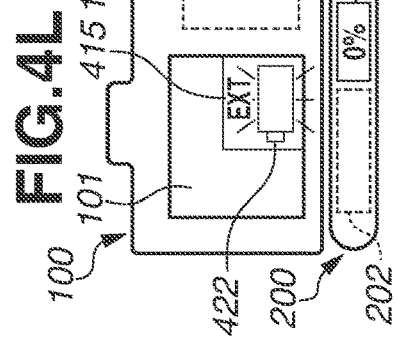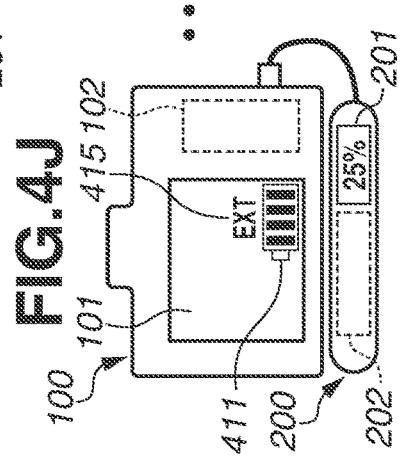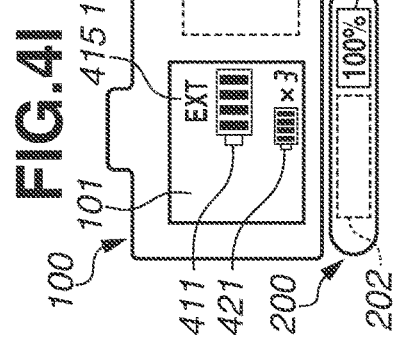

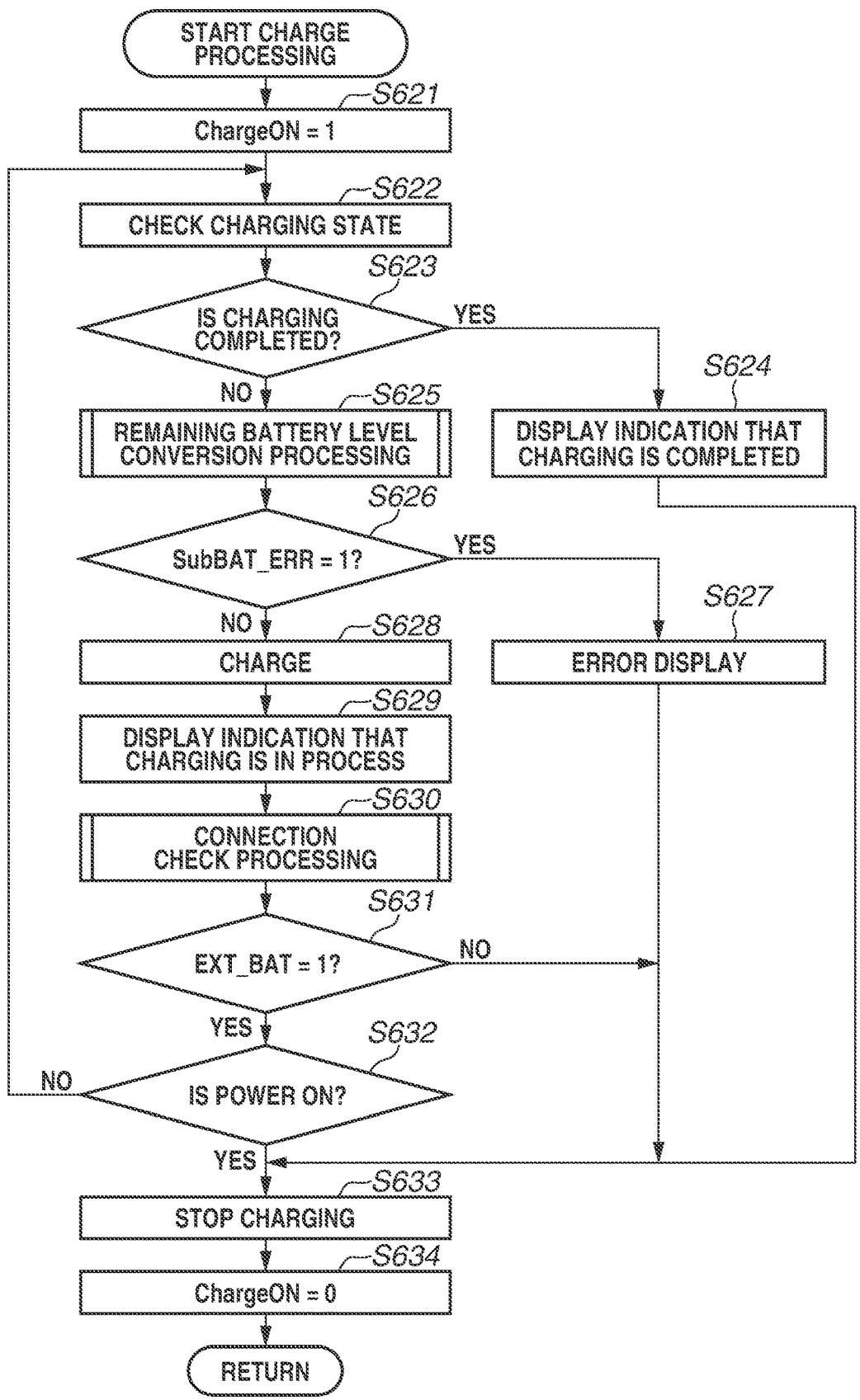

ELECTRONIC APPARATUS AND CONTROL METHOD

BACKGROUND

Field of the Disclosure

Aspects of the disclosure generally relate to an electronic apparatus and a control method thereof.

Description of the Related Art

Japanese Patent Application Laid-Open No. 09-113951 discusses a camera including a main battery and an auxiliary battery for charging the main battery.

In the camera discussed in Japanese Patent Application Laid-Open No. 09-113951, however, it is impossible for a user to know the remaining battery level of the auxiliary battery in terms of to what extent the main battery can be charged. The camera discussed in Japanese Patent Application Laid-Open No. 09-113951 is unable to notify the user of the relationship between the full charge capacity of the main battery and the remaining battery level of the auxiliary battery, either.

SUMMARY

According to an aspect of the embodiments, it is possible to notify a user of a relation between a full charge capacity of a battery of an electronic apparatus and a remaining battery level of a battery of a battery device connected to the electronic apparatus in an easily understandable manner.

According to an aspect of the embodiments, there is provided an electronic apparatus that includes a connection unit to which a battery device is connected, a calculation unit configured to calculate a remaining battery level of a battery of the battery device based on a full charge capacity of a battery of the electronic apparatus, and a display unit configured to display information indicating a result of calculation made by the calculation unit.

According to an aspect of the embodiments, there is provided a method including calculating by a calculation unit of an electronic apparatus a remaining battery level of a battery of a battery device connected to a connection unit of the electronic apparatus based on a full charge capacity of a battery of the electronic apparatus, and displaying information indicating a result of calculation made by the calculation unit on a display unit of the electronic apparatus.

According to an aspect of the embodiments, there is provided a non-transitory storage medium storing a program for causing a computer to execute a method that includes calculating by a calculation unit of an electronic apparatus a remaining battery level of a battery of a battery device connected to a connection unit of the electronic apparatus based on a full charge capacity of a battery of the electronic apparatus, and displaying information indicating a result of calculation made by the calculation unit on a display unit of the electronic apparatus.

Further aspects of the embodiments will become apparent from the following embodiments.

BRIEF DESCRIPTION OF THE DRAWINGS

FIGS. 3A to 3C are flowcharts illustrating an example of remaining battery level display processing.

FIGS. 4A to 4L are diagrams illustrating examples of a display mode of a remaining battery level of a battery.

FIGS. 6A and 6B are flowcharts illustrating another example of the remaining battery level display processing.

DESCRIPTION OF THE EMBODIMENTS

Exemplary embodiments, features, and aspects of the disclosure will be described below with reference to the drawings. However, aspects of the disclosure are not limited to the following embodiments.

Figure 1:
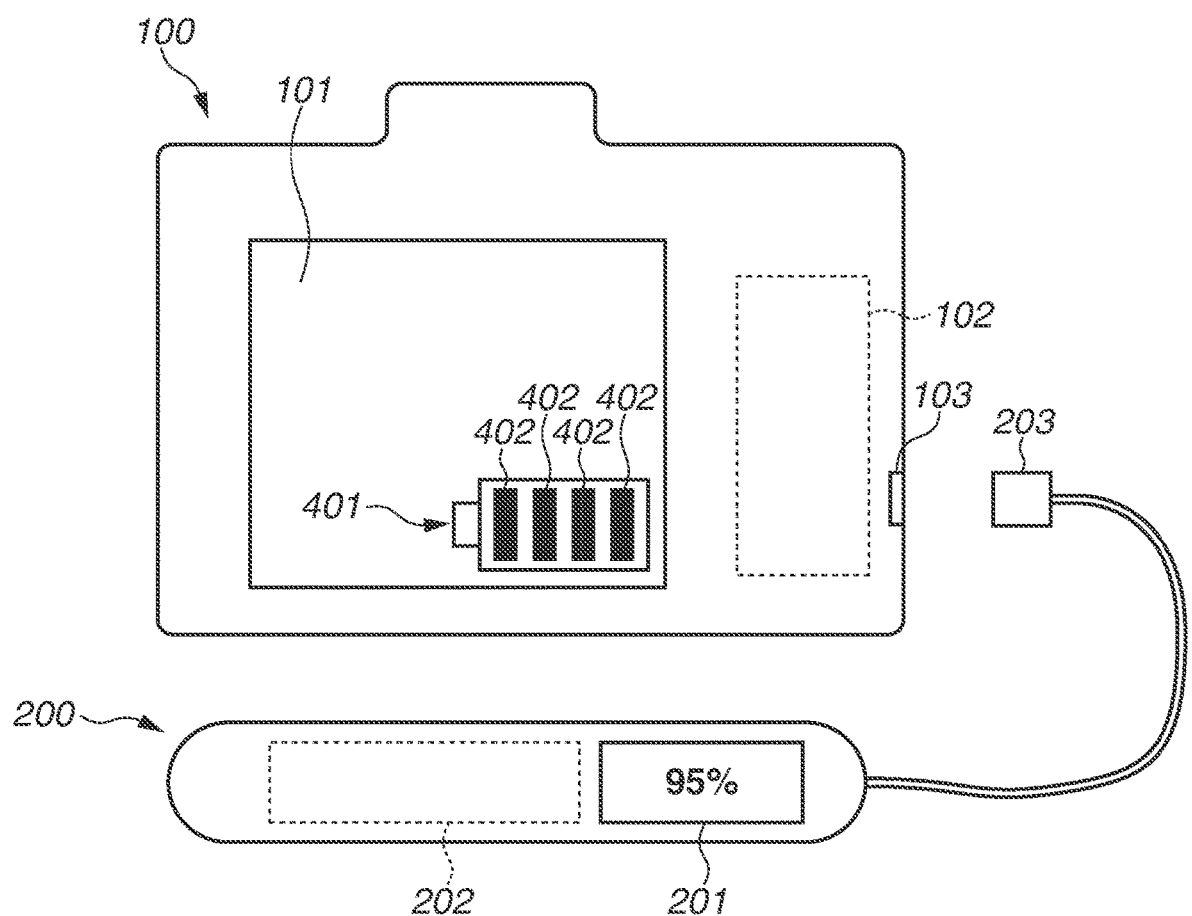
FIG. 1 is a diagram illustrating an example of appearance of an electronic apparatus and a battery device.

A first exemplary embodiment will be described. FIG. 1 is a diagram illustrating an example of the appearance of an electronic apparatus 100 and a battery device 200.

The electronic apparatus 100 is an apparatus that operates on power supplied from the battery device 200 and that also charges a battery 102 with the power supplied from the battery device 200. For example, the electronic apparatus 100 is an apparatus operating as a digital camera. The electronic apparatus 100 includes a display unit 101, the battery 102, and a connector 103, for example.

The display unit 101 can display battery information (e.g., a remaining battery level) about the battery 102. FIG. 1 illustrates an example where the display unit 101 displays the remaining battery level of the battery 102 by using a battery image 401. The display unit 101 can display a connection state of the battery device 200 connected to the electronic apparatus 100. The display unit 101 can display information indicating a result obtained by calculating the remaining battery level of a battery 202 based on the full charge capacity of the battery 102.

The battery 102 is a power supply of the electronic apparatus 100, and supplies power to the components of the electronic apparatus 100. The battery 102 may be built in the electronic apparatus 100 or removable from the electronic apparatus 100. For example, a lithium ion battery may be used as the battery 102. The connector 103 is a connector for connecting the electronic apparatus 100 to the battery device 200.

The battery device 200 is a device for supplying power to the electronic apparatus 100. For example, the battery device 200 is a device operating as a mobile battery. The battery device 200 includes a display unit 201, the battery 202, and a connector 203, for example.

The display unit 201 can display battery information (e.g., a remaining battery level) of the battery 202. For example, the display unit 201 displays the remaining battery level of the battery 202 in percentages. The battery 202 functions as a power supply of the electronic apparatus 100. An example of the battery 202 is a lithium ion battery.

The connector 203 is a connector for connecting the battery device 200 to the electronic apparatus 100. Connecting the connector 203 to the connector 103 of the electronic apparatus 100 starts power supply from the battery device 200 to the electronic apparatus 100.

Figure 2:
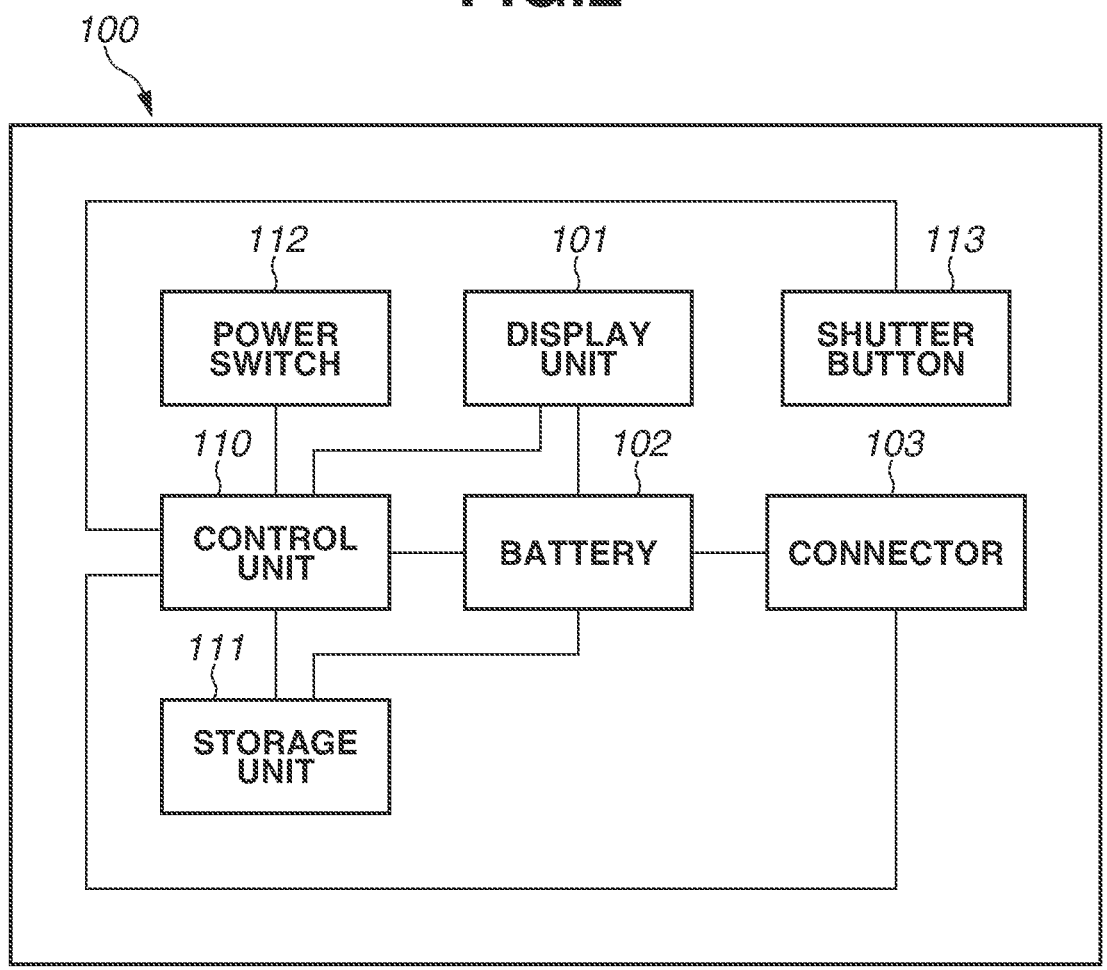
FIG. 2 is a block diagram illustrating components of the electronic apparatus.

Next, the components of the electronic apparatus 100 will be described with reference to FIG. 2. The components illustrated in FIG. 1 are designated by the same reference numerals, and a description thereof will be omitted.

For example, the electronic apparatus 100 includes a control unit 110, a storage unit 111, a power switch 112, and a shutter button 113.

The control unit 110 controls operation of the electronic apparatus 100 by controlling the components of the electronic apparatus 100. The control unit 110 also controls display of the remaining battery level of the battery 102 and the remaining battery level of the battery 202 by controlling the display unit 101. The control unit 110 performs the processing of the flowcharts of FIGS. 3A to 3C to be described below by executing a program stored in the storage unit 111. The storage unit 111 stores the program to be executed by the control unit 110, and information that the control unit 110 uses in performing processing. The storage unit 111 is also used as a working memory when the control unit 110 performs various types of processing.

The power switch 112 is a switch for activating the electronic apparatus 100. When the electronic apparatus 100 is activated by the power switch 112, the display unit 101 displays the remaining battery level of the battery 102. The shutter button 113 is a button to be operated in capturing an image.

Figure 3A:
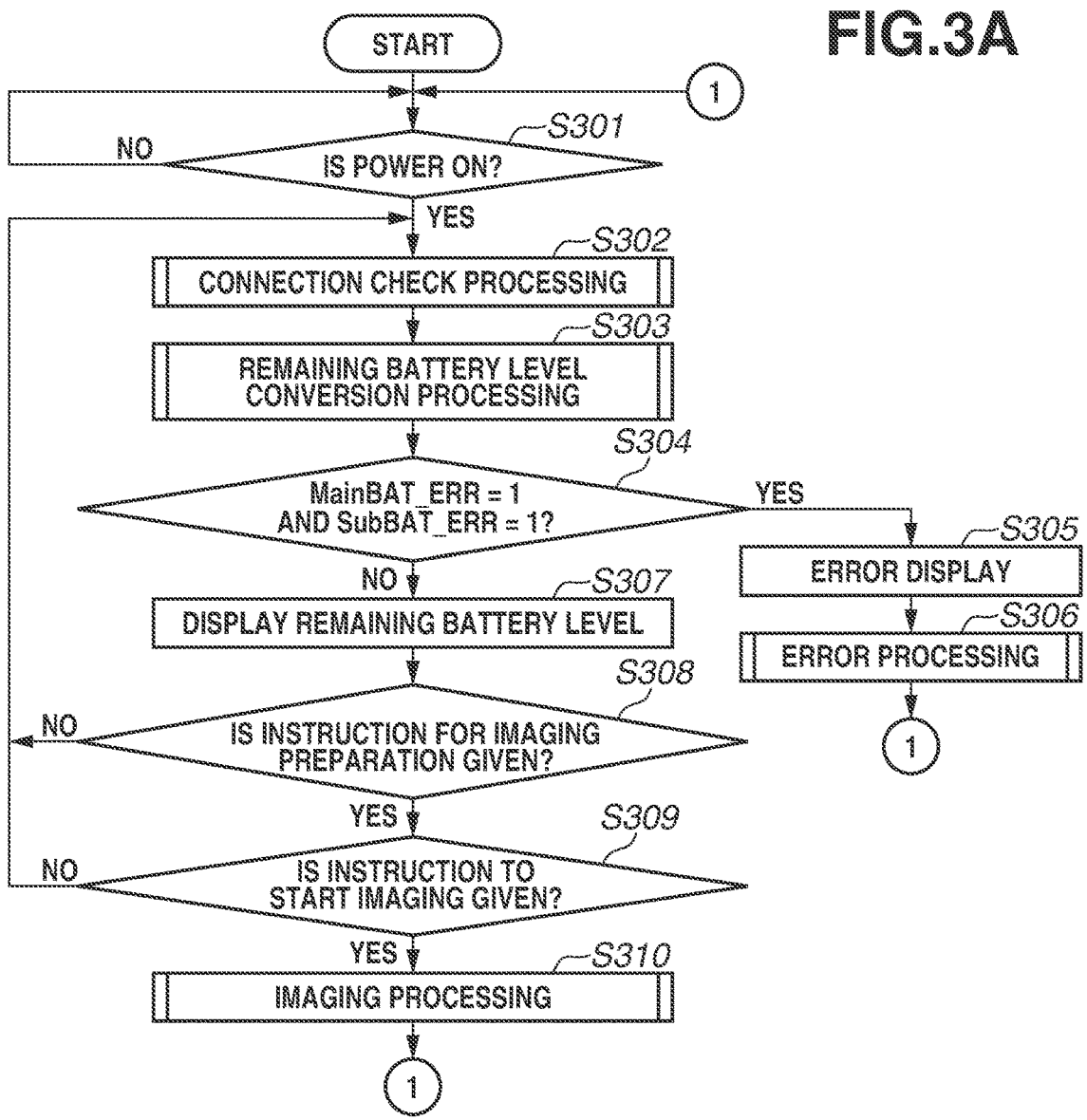

Next, an example of remaining battery level display processing will be described with reference to the flowchart of FIG. 3A. The flowchart of FIG. 3A is implemented by the control unit 110 executing the program stored in the storage unit 111.

In step S301, the control unit 110 determines whether the power of the electronic apparatus 100 is on from the state of the power switch 112. If the power of the electronic apparatus 100 is determined to be on (YES in step S301), the processing proceeds to step S302.

In step S302, the control unit 110 performs connection check processing.

Figure 3B:
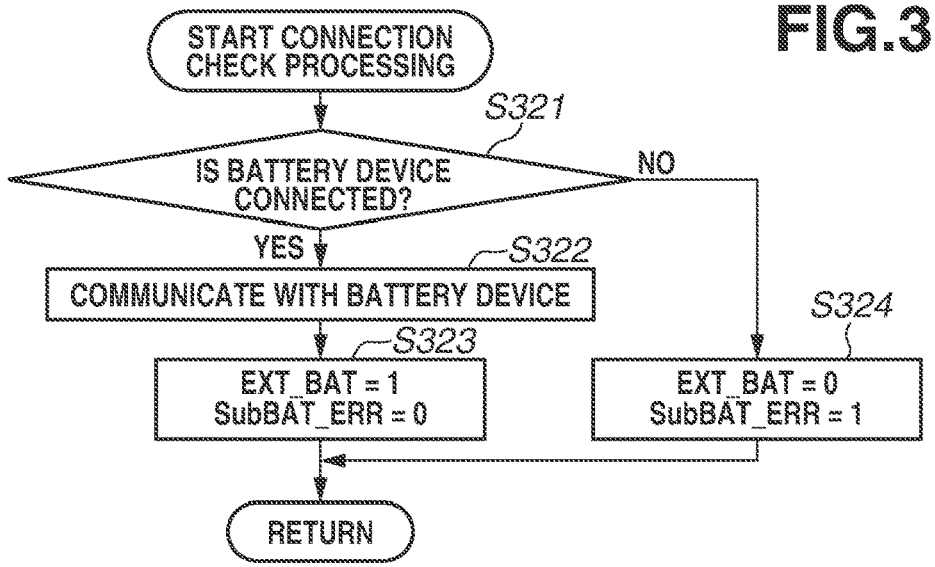

FIG. 3B is a flowchart illustrating an example of the connection check processing performed in step S302.

In step S321, the control unit 110 determines whether the battery device 200 is connected to the connector 103. If the battery device 200 is connected to the connector 103 (YES in step S321), the processing proceeds to step S322. If the battery device 200 is not connected to the connector 103 (NO in step S321), the processing proceeds to step S324.

In step S322, the control unit 110 communicates with the battery device 200 to obtain the remaining battery level of the battery 202 and a product identifier (ID) of the battery device 200 from the battery device 200, and stores the remaining battery level and the product ID in the storage unit 111. The control unit 110 obtains information about the full charge capacity of the battery 202 based on the product ID. Information about the full charge capacity of the battery 202 is stored in the storage unit 111 in association with the product ID. Alternatively, the control unit 110 may directly or indirectly obtain the information about the full charge capacity of the battery 202 from the battery device 200.

In step S323, the control unit 110 stores information indicating that the battery device 200 is connected in the storage unit 111. For example, the control unit 110 sets a battery presence/absence flag EXT_BAT to 1 and stores "1" as the value of EXT_BAT in the storage unit 111. If EXT_BAT is already 1, the control unit 110 continues to store "1" such that EXT_BAT=1.

In addition, the control unit 110 sets SubBAT_ERR that is a remaining battery level error flag on the battery 202 to 0 and stores "0" as the value of SubBAT_ERR in the storage unit 111. If SubBAT_ERR is already 0, the control unit 110 continues to store "0" such that SubBAT_ERR=0.

In step S324, the control unit 110 stores information indicating that the battery device 200 is not connected in the storage unit 111. For example, the control unit 110 sets EXT_BAT to 0 and stores "0" as the value of EXT_BAT in the storage unit 111. If EXT_BAT is already 0, the control unit 110 continues to store "0" such that EXT_BAT=0. The control unit 110 further sets SubBAT_ERR that is the remaining battery level error flag on the battery 202 to 1 and stores "1" as the value of SubBAT_ERR in the storage unit 111. If SubBAT_ERR is already 1, the control unit 110 continues to store "1" such that SubBAT_ERR=1.

After the processing of the foregoing step S323 or S324 is ended, the processing proceeds to step S303 of FIG. 3A.

In step S303, the control unit 110 performs remaining battery level conversion processing.

FIG. 3C is a flowchart illustrating an example of the remaining battery level conversion processing performed in step S303.

In step S341, the control unit 110 obtains information about the remaining battery level of the battery 102 and stores the remaining battery level in the storage unit 111.

In step S342, the control unit 110 determines whether the remaining battery level of the battery 102 is higher than or equal to a predetermined value (first predetermined value). If the remaining battery level is higher than or equal to the predetermined value (YES in step S342), the processing proceeds to step S343. If the remaining battery level is not higher than or equal to the predetermined value (NO in step S342), the processing proceeds to step S344. Information about the predetermined value is stored in the storage unit 111 in advance. The predetermined value is set to a value such that the remaining battery level immediately becomes zero when the electronic apparatus 100 is driven by the battery 102.

In step S343, the control unit 110 stores information indicating that the remaining battery level of the battery 102 is sufficient in the storage unit 111. For example, the control unit 110 sets MainBAT_ERR that is a remaining battery level error flag on the battery 102 to 0 and stores "0" as the value of MainBAT_ERR in the storage unit 111. If MainBAT_ERR is already 0, the control unit 110 continues to store "0" such that MainBAT_ERR=0.

In step S344, the control unit 110 stores information indicating that the remaining battery level of the battery 102 is insufficient in the storage unit 111. For example, the control unit 110 sets MainBAT_ERR that is the remaining battery level error flag on the battery 102 to 1 and stores "1" as the value of MainBAT_ERR in the storage unit 111. If MainBAT_ERR is already 1, the control unit 110 continues to store "1" such that MainBAT_ERR=1.

In step S345, the control unit 110 determines whether the battery device 200 is connected. For example, the control unit 110 determines whether EXT_BAT is 1. If the battery device 200 is connected, i.e., EXT_BAT is 1 (YES in step S345), the processing proceeds to step S346. If the battery device 200 is not connected, i.e., EXT_BAT is 0 (NO in step S345), the processing proceeds to step S350.

In step S346, the control unit 110 obtains information about the remaining battery level of the battery 202, substitutes the information into a variable SubBAT, and stores SubBAT in the storage unit 111. For example, the control unit 110 obtains the information about the remaining battery level by measuring the voltage of the battery 202 and calculating the remaining battery level of the battery 202 from the measured voltage value. However, the method for obtaining the information about the remaining battery level of the battery 202 is not limited in particular. The control unit 110 may directly or indirectly obtain the information about the remaining battery level from the battery device 200. The control unit 110 may obtain the information about the remaining battery level by calculation based on the use time and usage of the battery 202.

In step S347, the control unit 110 determines whether the remaining battery level of the battery 202 is higher than or equal to a predetermined value (second predetermined value). If the remaining battery level is higher than or equal to the predetermined value (YES in step S347), the processing proceeds to step S348. If the remaining battery level is not higher than or equal to the predetermined value (NO in step S347), the processing proceeds to step S350. Information about the predetermined value is stored in the storage unit 111 in advance. The predetermined value is set to a value such that the remaining battery level immediately becomes zero if the electronic apparatus 100 is powered by the battery 202.

In step S348, the control unit 110 stores information indicating that the remaining battery level of the battery 202 is sufficient in the storage unit 111. For example, the control unit 110 sets SubBAT_ERR that is the remaining battery level error flag on the battery 202 to 0 and stores "0" as the value of SubBAT_ERR in the storage unit 111. If SubBAT_ERR is already 0, the control unit 110 continues to store "0" such that SubBAT_ERR=0.

In step S349, the control unit 110 calculates how many batteries 102 the remaining battery level of the battery 202 corresponds to. For example, the control unit 110 calculates the number of batteries, N, by dividing the remaining battery level of the battery 202 obtained in step S346 by the full charge capacity of the battery 102. The information about the full charge capacity of the battery 102 is stored in the storage unit 111 in advance. The number N is calculated by using the following equation:

Number $N$=the remaining battery level of the battery 202/the full charge capacity of the battery 102.

The value N obtained by dividing the remaining battery level of the battery 202 by the full charge capacity of the battery 102 may include a decimal part after the decimal point. In such a case, the control unit 110 substitutes the integral part before the decimal point into a variable I and the decimal part after the decimal point into a variable D, and stores I and D in the storage unit 111. For example, if N=3.5, the control unit 110 substitutes the integral part "3" into I and the decimal part "0.5" into D, and stores I and D in the storage unit 111. For another example, if N=0.5, the control unit 110 substitutes the integral part "0" into I and the decimal part "0.5" into D, and stores I and D in the storage unit 111. Alternatively, the control unit 110 may round up or down the fractional part of the number N after the decimal point and use only the integral part. For example, if N=0.5 and the fractional part after the decimal point is rounded up, the resulting integral part "1" is substituted into I and stored. If the fractional part after the decimal point is rounded down, the resulting integral part "0" is substituted into I and stored.

In step S350, the control unit 110 stores information indicating that the remaining battery level of the battery 202 is insufficient in the storage unit 111. For example, the control unit 110 sets SubBAT_ERR that is the remaining battery level error flag on the battery 202 to 1 and stores "1" as the value of SubBAT_ERR in the storage unit 111. If SubBAT_ERR is already 1, the control unit 110 continues to store "1" such that SubBAT_ERR=1.

After the processing of the foregoing step S349 or S350 is ended, the processing proceeds to step S304 of FIG. 3A.

In step S304, the control unit 110 determines whether a predetermined condition is satisfied. The predetermined condition is satisfied if the remaining battery level of the battery 102 is insufficient and the remaining battery level of the battery 202 is also insufficient. If the remaining battery level of at least either one of the batteries 102 and 202 is sufficient, the predetermined condition is not satisfied. If the predetermined condition is determined to be satisfied (YES in step S304), the processing proceeds to step S305. If the predetermined condition is determined to be not satisfied (NO in step S304), the processing proceeds to step S307. For example, if MainBAT_ERR that is the remaining battery level error flag on the battery 102 is 1 and SubBAT_ERR that is the remaining battery level error flag on the battery 202 is also 1, the processing proceeds to step S305. If the MainBAT_ERR that is the remaining battery level error flag on the battery 102 is 0 and/or SubBAT_ERR that is the remaining battery level error flag on the battery 202 is 0, the processing proceeds to step S307. In a case where the battery device 200 is not connected, the control unit 110 determines whether the predetermined condition is satisfied based on whether the remaining battery level of the battery 102 is sufficient as the predetermined condition. For example, the control unit 110 determines whether MainBAT_ERR that is the remaining battery level error flag on the battery 102 is 1. If MainBAT_ERR is 1, the processing proceeds to step S305. If MainBAT_ERR is 0, the processing proceeds to step S307.

In step S305, the control unit 110 gives an error display indicating that the remaining battery level is insufficient on the display unit 101. For example, the control unit 110 displays an image or message indicating that the batteries 102 and 202 are dead on the display unit 101.

In step S306, the control unit 110 performs error processing. An example of the error processing is processing for prompting the user to charge the battery 102 or 202. After the end of the error processing, the processing returns to step S301.

In step S307, the control unit 110 displays the remaining battery level of the battery 102 or the remaining battery level of the battery 202 on the display unit 101. Here, the control unit 110 displays the remaining battery level in different display modes depending on whether the battery device 200 is connected. In a case where the battery device 200 is connected, the control unit 110 displays information indicating the result obtained by calculating the remaining battery level of the battery 202 based on the full charge capacity of the battery 102. In a case where the battery device 200 is not connected, the control unit 110 displays the proportion of the remaining battery level of the battery 102 to the full charge capacity of the battery 102 in a user-recognizable manner.

FIGS. 4A to 4D illustrates display examples of the remaining battery level of the battery 102 in the case where the battery device 200 is not connected to the electronic apparatus 100.

FIG. 4A illustrates a power supply state where the electronic apparatus 100 starts to be powered by the battery 102. The display unit 101 displays a battery image 401. The battery image 401 displays the remaining battery level of the battery 102. The battery image 401 will now be described with reference to FIG. 1. The battery image 401 includes a plurality of (in this example, four) rectangular blocks 402 arranged inside. Each block 402 represents a portion of the full charge capacity of the battery 102. Each block 402 is displayed either in black or in white inside. For example, a black block 402 indicates the presence of a remaining amount of battery equivalent to an amount of charge corresponding to one block 402. A white block 402 indicates the absence of a remaining amount of battery equivalent to the amount of charge corresponding to one block 402. All the blocks 402 in the battery image 401 illustrated in FIGS. 1 and 4A are black, which indicates that the remaining battery level of the battery 102 is equivalent to the full charge capacity of the battery 102.

FIG. 4B illustrates a state where some time has passed from the power supply state of FIG. 4A. The display unit 101 displays a battery image 403. The battery image 403 is displayed by changing one of the blocks 402 in the battery image 401 of FIG. 4A from black to white. The battery image 403 indicates that the remaining battery level has decreased as much as one block 402 compared to the battery image 401 of FIG. 4A.

FIG. 4C illustrates a state where some time has passed from the power supply state of FIG. 4B. The display unit 101 displays a battery image 404. In the displayed battery image 404, two of the blocks 402 in the battery image 403 of FIG. 4B are changed from black to white. The battery image 404 indicates that the remaining battery level has decreased as much as two blocks 402 compared to the battery image 403 of FIG. 4B.

FIG. 4D illustrates a state where some time has passed from the power supply state of FIG. 4C. The display unit 101 displays a battery image 405. The battery image 405 is displayed without a black block. The battery image 405 is an example of the error display indicating that the remaining battery level of the battery 102 is insufficient. The display unit 101 also blinks the battery image 405 to prompt the user to charge the battery 102.

FIGS. 4E to 4H illustrate display examples of the remaining battery level of the battery 202 in the case where the battery device 200 is connected to the electronic apparatus 100.

FIG. 4E illustrates a power supply state where the electronic apparatus 100 starts to be powered by the battery 202. The display unit 201 displays "100%", indicating that the remaining battery level of the battery 202 is equivalent to the full charge capacity of the battery 202. The display unit 101 displays information indicating the result obtained by calculating the remaining battery level of the battery 202 based on the full charge capacity of the battery 102. For example, the display unit 101 displays four aligned battery images 411 together with an "EXT" mark 415 indicating that power is being supplied from the battery device 200. In FIG. 4E, the display unit 101 displays an indication that the remaining battery level of the battery 202 corresponds to four batteries 102.

Figure 5A:
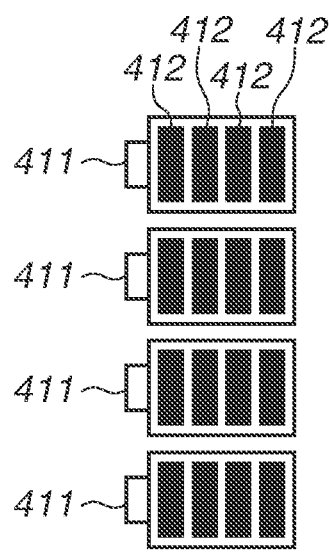
FIGS. 5A to 5E are diagrams illustrating examples of the display mode of the remaining battery level of the battery.

FIG. 5A is an enlarged view of the battery images 411 on the display unit 101 illustrated in FIG. 4E. FIG. 5A illustrates the four battery images 411 on an enlarged scale. The battery images 411 illustrated in FIG. 5A each include a plurality of (in this example, four) rectangular blocks 412 arranged inside. Each block 412 is displayed either in black or in white inside. For example, a black block 412 in a battery image 411 indicates the presence of a remaining amount of the battery 202 equivalent to an amount corresponding to one block 412. A white block 412 in a battery image 411 indicates the absence of a remaining amount of the battery 202 equivalent to an amount corresponding to one block 412. Each battery image 411 with only black blocks 412 illustrated in FIG. 5A indicates a remaining battery level of the battery 202 as much as one battery 102. The battery images 411 correspond to battery images indicating a charged state, for example. The battery images 411 correspond to predetermined images or second battery images, for example.

By visually observing the four battery images 411 with only black blocks 412 illustrated in FIG. 5A, the user can find out that the remaining battery level of the battery 202 corresponds to four batteries 102. In FIG. 4E, the display unit 101 thus displays an indication that the remaining battery level of the battery 202 corresponds to four batteries 102.

Now, processing to be executed by the control unit 110 to display the four battery images 411 illustrated in FIG. 4E on the display unit 101 will be described.

In the foregoing step S349, the control unit 110 calculates how many batteries 102 the remaining battery level of the battery 202 corresponds to. Suppose here that the control unit 110 has already obtained the information about the remaining battery level of the battery 202 and the information about the full charge capacity of the battery 102. The control unit 110 divides the remaining battery level of the battery 202 by the full charge capacity of the battery 102, whereby the number N is calculated to be 4. The control unit 110 substitutes the integral part "4" into I, and stores I in the storage unit 111.

Subsequently, in step S307, the control unit 110 displays four aligned battery images 411 on the display unit 101 based on the value of 4 substituted into I representing the integral part. The storage unit 111 stores image data on the battery image 411 in advance. Displaying the four aligned battery images 411 on the display unit 101 thus allows the user to easily find out that the remaining battery level of the battery 202 calculated based on the full charge capacity of the battery 102 corresponds to four batteries 102.

FIG. 4F illustrates a state where some time has passed from the power supply state of FIG. 4E. The display unit 201 displays "25%", indicating that the remaining battery level of the battery 202 is 25%. The display unit 101 displays one battery image 411 and three battery images 413 in a line.

Figure 5B:
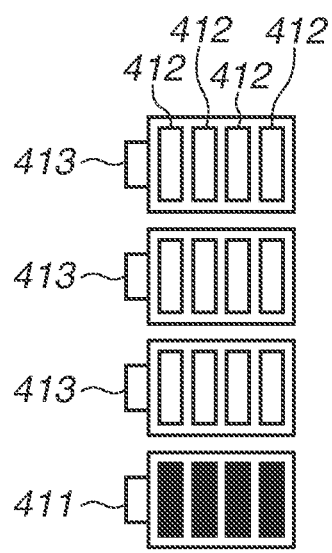

FIG. 5B is an enlarged view of the battery images 411 and 413 on the display unit 101 illustrated in FIG. 4F. FIG. 5B illustrates one battery image 411 and three battery images 413 on an enlarged scale.

The battery image 411 illustrated in FIG. 5B is the same image as those illustrated in FIG. 5A. The battery images 413 illustrated in FIG. 5B each include a plurality of (in this example, four) rectangular blocks 412 arranged inside, and all the blocks 412 are white. Each battery image 413 with only white blocks 412 indicates that the remaining battery level of the battery 202 has decreased as much as one battery 102. A battery image 413 with only white blocks 412 may be referred to as an empty battery image 413. The battery image 413 corresponds to a battery image indicating a charged state, for example. The battery image 413 corresponds to a predetermined image or third battery image, for example.

By visually observing one battery image 411 with only black blocks 412 as illustrated in FIG. 5B, the user can find out that the remaining battery level of the battery 202 corresponds to one battery 102. By visually observing the three battery images 413 with only white blocks 412 in FIG. 5B, the user can find out that the remaining battery level of the battery 202 has decreased as much as three batteries 102.

In FIG. 4F, the display unit 101 thus displays an indication that the remaining battery level of the battery 202 corresponds to one battery 102.

Processing executed by the control unit 110 to display one battery image 411 and three battery images 413 as illustrated in FIG. 4F on the display unit 101 will be described.

In the foregoing step S349, the control unit 110 divides the remaining battery level of the battery 202 by the full charge capacity of the battery 102, whereby the number N is calculated to be 1. The control unit 110 substitutes the integral part "1" into I, and stores I in the storage unit 111.

Subsequently, in step S307, the control unit 110 displays one battery image 411 on the display unit 101 based on the value of "1" substituted into I representing the integral part. The control unit 110 also displays three empty battery images 413 for the other three battery images. Displaying one battery image 411 and three battery images 413 in a line on the display unit 101 thus allows the user to find out that the remaining battery level of the battery 202 calculated based on the full charge capacity of the battery 102 corresponds to one battery 102.

Another method where the control unit 110 displays three empty battery images 413 for the other three battery images will be described. The control unit 110 calculates how many batteries 102 the full charge capacity of the battery 202 corresponds to in advance by the following equation:

$$N\text{max} = \text{the full charge capacity of the battery 202/the full charge capacity of the battery 102.}$$

Nmax is a value indicating how many batteries 102 the full charge capacity of the battery 202 corresponds to. If the calculated value Nmax includes a decimal part, the control unit 110 may round up or down the fractional part after the decimal point to have only the integral part.

Next, the control unit 110 subtracts N from Nmax, and can display empty battery images 413 based on the value of the integral part of the difference. For example, if Nmax is 4 and N is 1.5, two empty battery images 413 are displayed based on the value of the integral part, "2", of a difference 2.5 obtained by subtracting 1.5 from 4.

FIG. 4G illustrates a state where some time has passed from the power supply state of FIG. 4F. The display unit 201 displays "10%" indicating that the remaining battery level of the battery 202 is 10%. The display unit 101 displays three battery images 413 and one battery image 414 in a line.

Figure 5C:
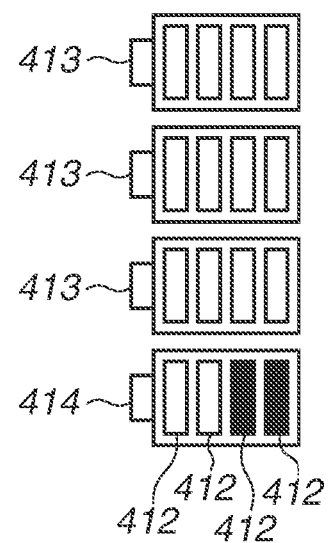

FIG. 5C is an enlarged view of the battery images 413 and 414 on the display unit 101 illustrated in FIG. 4G. FIG. 5C illustrates three battery images 413 and one battery image 414 on an enlarged scale.

The battery images 413 illustrated in FIG. 5C are the same images as those illustrated in FIG. 5B. The battery image 414 illustrated in FIG. 5C includes a plurality of (in this example, four) rectangular blocks 412 arranged inside. The first and second blocks 412 from one end are black, and the third and fourth from the end are white. One battery image 414 including both black and white blocks 412 represents a portion of the remaining battery level of the battery 202 less than one battery 102. The battery image 414 corresponds to a battery image indicating a partly charged state, for example. The battery image 414 corresponds to a predetermined image or first battery image, for example.

By visually observing one battery image 414 including both black and white blocks 412 as illustrated in FIG. 5C, the user can find out that the remaining battery level of the battery 202 is less than one battery 102. In FIG. 4G, the display unit 101 thus displays an indication that the remaining battery level of the battery 202 is less than one battery 102.

Processing executed by the control unit 110 to display three battery images 413 and one battery image 414 as illustrated in FIG. 4G on the display unit 101 will be described.

In the foregoing step S349, the control unit 110 divides the remaining battery level of the battery 202 by the full charge capacity of the battery 102, whereby the number N is calculated to be 0.5. The control unit 110 substitutes the integral part "0" into I, substitutes the decimal part "0.5" into the D, and stores I and D in the storage unit 111.

Subsequently, in step S307, the control unit 110 determines the number of black blocks 412 among the blocks 412 of the battery image 414 based on the value of D representing the decimal part. As the decimal part (the value of D) is larger, the control unit 110 displays more black blocks 412 among the blocks 412 of the battery image 414. As a specific example, if $0<D\leq 0.3$, the control unit 110 displays only the first block 412 from one end in black, and the other blocks 412 in white. If $0.3<D\leq 0.6$, the control unit 110 displays the first and second blocks 412 from the end in black, and the other blocks 412 in white. If $0.6<D<1.0$, the control unit 110 displays the first to third blocks 412 from the end in black, and the other block 412 in white. The divisions $0<D\leq 0.3$, $0.3<D\leq 0.6$, and $0.6<D<1.0$ are just examples, and the control unit 110 can change the boundary values. The control unit 110 can also change the boundary values depending on the number of blocks 412 arranged inside the battery image 414.

Displaying one battery image 414 on the display unit 101 thus allows the user to find out that the remaining battery level of the battery 202 calculated based on the full charge capacity of the battery 102 is less than one battery 102. The display unit 101 displays the battery image 414 if the remaining battery level of the battery 202 is unable to be represented by an integral number of batteries 102.

FIG. 4H illustrates a state where some time has passed from the power supply state of FIG. 4G. The display unit 201 displays "0%", indicating that the battery 202 is dead. The display unit 101 displays four battery images 413 since the remaining battery level of the battery 202 is not higher than or equal to a predetermined value. The display unit 101 also blinks the battery images 413 to prompt the user to charge the battery 202.

Figure 5D:
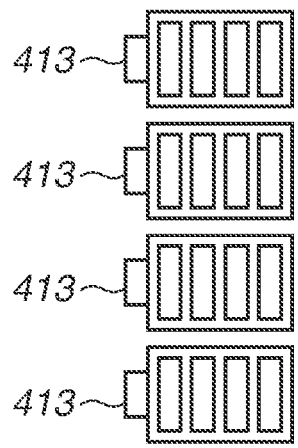

FIG. 5D is an enlarged view of the battery images 413 on the display unit 101 illustrated in FIG. 4H. FIG. 5D illustrates four battery images 413 on an enlarged scale.

The battery images 413 illustrated in FIG. 5D are the same images as those illustrated in FIG. 5B. By visually observing the four battery images 413 with only white blocks 412 in FIG. 5D, the user can find out that the battery 202 is dead.

Processing to be executed by the control unit 110 to display the battery images 413 illustrated in FIG. 4H on the display unit 101 will be described.

In the foregoing step S304, the control unit 110 determines that the remaining battery levels of both the batteries 102 and 202 are insufficient (YES in step S304), and the processing proceeds to step S305.

In step S305, the control unit 110 displays the empty battery images 413 on the display unit 101 as an error display indicating that the remaining battery level of the battery 202 is insufficient.

In step S306, as the error processing, the control unit 110 blinks the empty battery images 413 to prompt the user to charge the battery 202.

Displaying the empty battery images 413 on the display unit 101 thus allows the user to find out that the battery 202 needs to be charged.

FIGS. 4I to 4L illustrate modifications of the display of the remaining battery level of the battery 202 in the case where the battery device 200 is connected to the electronic apparatus 100.

FIG. 4I illustrates a power supply state where the electronic apparatus 100 starts to be powered by the battery 202. The remaining battery level of the battery 202 in FIG. 4I is the same as that in FIG. 4E. The display unit 101 displays information indicating the result obtained by calculating the remaining battery level of the battery 202 based on the full charge capacity of the battery 102.

Figure 5E:
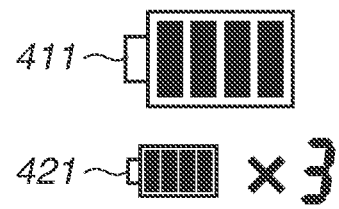

FIG. 5E is an enlarged view of the images on the display unit 101 illustrated in FIG. 4I.

As illustrated in FIG. 5E, the display unit 101 displays one battery image 411 and a combination of a battery image 421 and "×number". The battery image 411 and the battery image 421 have different sizes. The battery image 411 is larger than the battery image 421.

The battery image 411 illustrated in FIG. 5E is the same image as those illustrated in FIG. 5A, and indicates that the remaining battery level of the battery 202 corresponds to one battery 102. The combination of the battery image 421 and "×number" illustrated in FIG. 5E indicates that the battery 202 includes more than the amount of charge corresponding to the battery image 411. Specifically, the combination of the battery image 421 and "×3" indicates that the additional remaining battery level of the battery 202 corresponds to three batteries 102.

By visually observing the battery image 411 and the combination of the battery image 421 and "×3", the user can find out that the remaining battery level of the battery 202 calculated based on the full charge capacity of the battery 102 corresponds to four batteries 102. The user can also find out that the charge capacity of the battery 202 corresponding to the first one of the four batteries 102 is in use.

Processing to be executed by the control unit 110 to display the battery image 411 and the combination of the battery image 421 and "×3" illustrated in FIG. 4I on the display unit 101 will be described. Suppose that the number N is calculated to be 4, and 4 is substituted into I representing the integral part. No value is substituted into D representing the decimal part.

In step S307, the control unit 110 displays one battery image 411 since the value of I representing the integral part is 1 or more and the value of D representing the decimal part is not stored. The control unit 110 also displays the battery image 421 and "×3" based on a difference of 3 obtained by subtracting 1 from the value 4 substituted into I representing the integral part.

FIG. 4J illustrates a state where some time has passed from the power supply state of FIG. 4I. The remaining battery level of the battery 202 in FIG. 4J is the same as that in FIG. 4F. The display unit 101 of the electronic apparatus 100 displays information indicating the result obtained by calculating the remaining battery level of the battery 202 based on the full charge capacity of the battery 102.

As illustrated in FIG. 4J, the display unit 101 displays one battery image 411. The battery image 411 illustrated in FIG. 4J is the same image as those illustrated in FIG. 5A, and indicates that the remaining battery level of the battery 202 corresponds to one battery 102. By visually observing the battery image 411, the user can find out that the remaining battery level of the battery 202 calculated based on the full charge capacity of the battery 102 corresponds to one battery 102.

Processing to be executed by the control unit 110 to display one battery image 411 as illustrated in FIG. 4J on the display unit 101 will be described. Suppose that the number N is calculated to be 1, and 1 is substituted into I representing the integral part. No value is substituted into D representing the decimal part.

In step S307, the control unit 110 displays one battery image 411 since the value of I representing the integral part is 1 or more and the value of D representing the decimal part is not stored. The control unit 110 does not display the battery image 421 or "×number" since the difference obtained by subtracting 1 from the value of 1 substituted into I representing the integral part is 0.

FIG. 4K illustrates a state where some time has passed from the power supply state of FIG. 4J. The remaining battery level of the battery 202 in FIG. 4K is the same as that in FIG. 4G. The display unit 101 displays information about the result obtained by calculating the remaining battery level of the battery 202 based on the full charge capacity of the battery 102.

As illustrated in FIG. 4K, the display unit 101 displays one battery image 414. The battery image 414 illustrated in FIG. 4K is the same image as that illustrated in FIG. 5C, and indicates a portion of the remaining battery level of the battery 202 less than one battery 102. By visually observing the battery image 414, the user can find out that the remaining battery level of the battery 202 calculated based on the full charge capacity of the battery 102 is less than one battery 102.

Processing to be executed by the control unit 110 to display the one battery image 414 illustrated in FIG. 4K on the display unit 101 will be described. Suppose that the number N is calculated to be 0.5, and 0 is substituted into I representing the integral part and 0.5 is substituted into D representing the decimal part.

In step S307, the control unit 110 does not display the battery image 411 indicating a charged state, since the value of I representing the integral part is 0. The control unit 110 displays the first and second blocks 412 from one end of the battery image 414 in black based on the value of 0.5 substituted into D representing the decimal part.

FIG. 4L illustrates a state where some time has passed from the power supply state of FIG. 4K. The remaining battery level of the battery 202 in FIG. 4L is the same as that in FIG. 4H.

Since the remaining battery level of the battery 202 is insufficient, the display unit 101 of the electronic apparatus 100 displays a battery image 422 indicating that the remaining battery level of the battery 202 is insufficient. The battery image 422 is displayed without a black block. The battery image 422 is an example of the error display indicating that the remaining battery level of the battery 202 is insufficient. The display unit 101 also blinks the battery image 422 to prompt the user to charge the battery 202.

Processing to be executed by the control unit 110 to display the battery image 422 illustrated in FIG. 4L on the display unit 101 is similar to the processing for displaying the battery image 413 illustrated in FIG. 4H.

In step S308, the control unit 110 determines whether an instruction for imaging preparation is given. For example, if the shutter button 113 is half-pressed, the control unit 110 determines that an instruction for imaging preparation is given. If an instruction for imaging preparation is given (YES in step S308), the processing proceeds to step S309. If no instruction for imaging preparation is given (NO in step S308), the processing returns to step S302.

In step S309, the control unit 110 determines whether an instruction to start imaging is given. For example, if the shutter button 113 is fully pressed, the control unit 110 determines that an instruction to start imaging is given. If an instruction to start imaging is given (YES in step S309), the processing proceeds to step S310. If no instruction to start imaging is given (NO in step S309), the processing returns to step S302.

In step S310, the control unit 110 starts imaging processing. After the imaging processing is ended, the processing returns to step S301.

As described above, according to the first exemplary embodiment, the display unit 101 of the electronic apparatus 100 can display information indicating the result obtained by calculating the remaining battery level of the battery 202 based on the full charge capacity of the battery 102.

Moreover, according to the first exemplary embodiment, the display unit 101 can display the information indicating the result obtained by calculating the remaining battery level of the battery 202 based on the full charge capacity of the battery 102 in a case where the electronic apparatus 100 is powered by the battery device 200. The user can thus find out how many batteries 102 the power supplied from the battery device 200 corresponds to. The display unit 101 may similarly display the information indicating the result obtained by calculating the remaining battery level of the battery 202 based on the full charge capacity of the battery 102 when the battery 102 is being charged with the power from the battery device 200.

In addition, according to the first exemplary embodiment, the display unit 101 can display the information indicating the result obtained by calculating the remaining battery level of the battery 202 based on the full charge capacity of the battery 102 in response to the connection of the battery device 200 to the electronic apparatus 100.

In the first exemplary embodiment, the description has been given of an example in which the remaining battery level of the battery 202 is displayed when the electronic apparatus 100 is powered by the battery device 200. In a second exemplary embodiment, a case where the remaining battery level of a battery 102 is displayed when a battery 102 is charged with power from a battery device 200 will be described. A description of processing similar to that described in the first exemplary embodiment will be omitted.

Figure 6A:
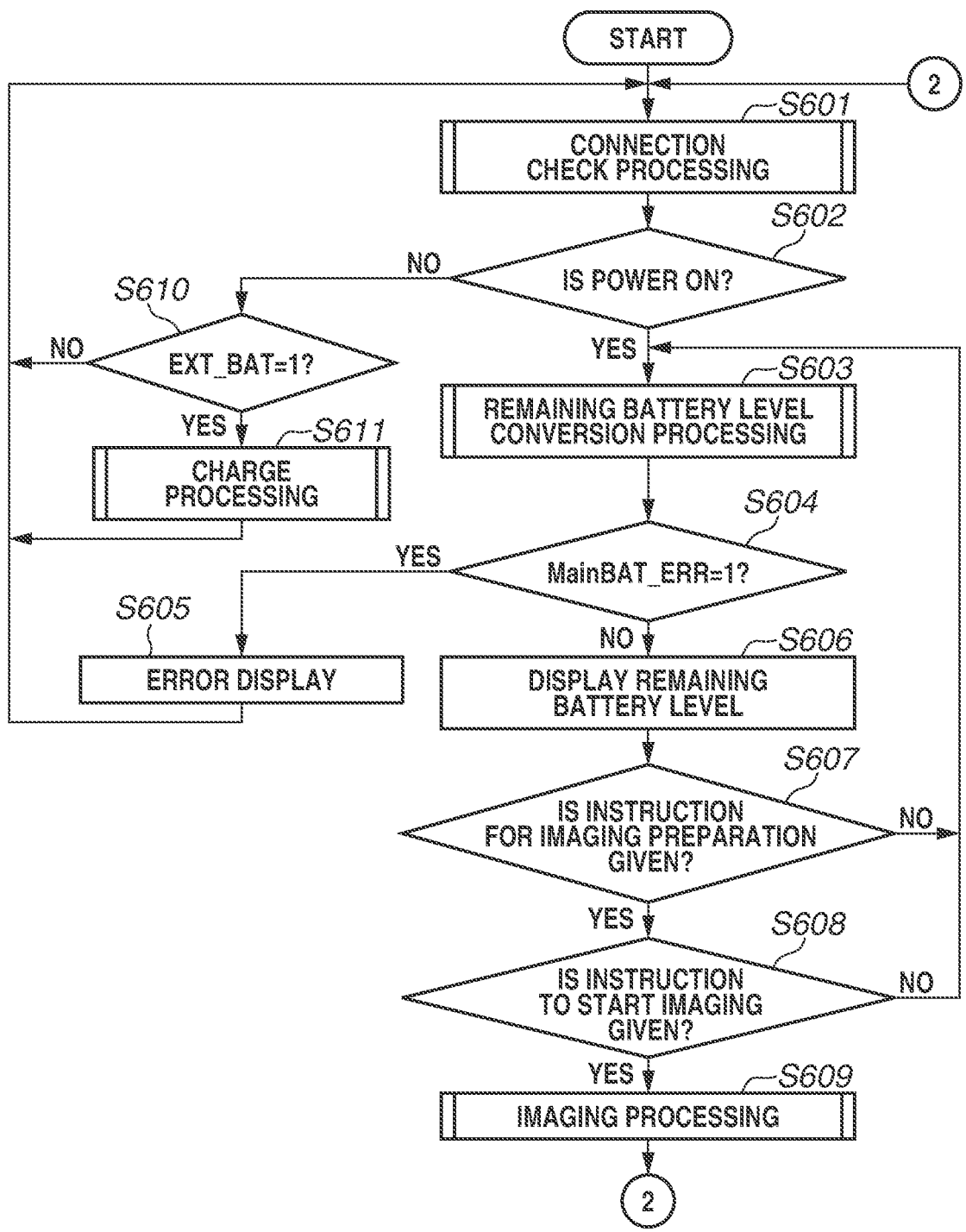

FIG. 6A is a flowchart for describing another example of the remaining battery level display processing. The flowchart of FIG. 6A is implemented by a control unit 110 executing a program stored in a storage unit 111.

In step S601, the control unit 110 performs connection check processing. The connection check processing is similar to that of FIG. 3B described above.

In step S602, the control unit 110 determines whether the power of the electronic apparatus 100 is on from the state of a power switch 112. If the power is on (YES in step S602), the processing proceeds to step S603. If the power is not on (NO in step S602), the processing proceeds to step S610.

In step S603, the control unit 110 performs remaining battery level conversion processing. The remaining battery level conversion processing is similar to that of FIG. 3C described above.

In step S604, the control unit 110 determines whether a condition that the battery 102 is not sufficiently charged is satisfied. For example, the control unit 110 determines whether MainBAT_ERR that is the remaining battery level error flag on the battery 102 is 1. If MainBAT_ERR is 1 (YES in step S604), the processing proceeds to step S605. If MainBAT_ERR is 0 (NO in step S604), the processing proceeds to step S606.

In step S605, the control unit 110 gives an error display indicating that the remaining battery level of the battery 102 is insufficient on the display unit 101.

In step S606, the control unit 110 display the remaining battery level of the battery 102 or the remaining battery level of the battery 202 on the display unit 101. The processing of step S606 is similar to that of step S307 in FIG. 3A described above.

In step S607, the control unit 110 determines whether an instruction for imaging preparation is given. The processing of step S607 is similar to that of step S308 in FIG. 3A described above. If an instruction for imaging preparation is given (YES in step S607), the processing proceeds to step S608. If no instruction for imaging preparation is given (NO in step S607), the processing returns to step S603.

In step S608, the control unit 110 determines whether an instruction to start imaging is given. The processing of step S608 is similar to that of step S309 in FIG. 3A described above. If an instruction to start imaging is given (YES in step S608), the processing proceeds to step S609. If no instruction to start imaging is given (NO in step S608), the processing returns to step S603.

In step S609, the control unit 110 starts imaging processing. After the imaging processing is ended, the processing returns to step S601.

In step S610, the control unit 110 determines whether the battery device 200 is connected to the electronic apparatus 100. For example, the control unit 110 determines whether the battery presence/absence flag EXT_BAT is 1. If EXT_BAT is 1 (YES in step S610), the processing proceeds to step S611. If EXT_BAT is 0 (NO in step S610), the processing returns to step S601.

In step S611, the control unit 110 performs charge processing.

FIG. 6B is a flowchart illustrating an example of the charge processing performed in step S611.

In step S621, the control unit 110 stores information indicating that charging is in process in the storage unit 111. For example, the control unit 110 sets a charging state flag ChargeON to 1 and stores "1" as the value of ChargeON in the storage unit 111. If ChargeON is already 1, the control unit 110 continues to store "1" such that ChargeON=1.

In step S622, the control unit 110 checks the charging state of the battery 102. For example, the control unit 110 obtains information about the remaining battery level of the battery 102 and stores the information in the storage unit 111.

In step S623, the control unit 110 determines whether the charging of the battery 102 is completed. For example, the control unit 110 determines whether the remaining battery level of the battery 102 is higher than or equal to a predetermined value (third predetermined value). Information about the predetermined value is stored in the storage unit 111 in advance. The predetermined value is set to a value such that the remaining battery level of the battery 102 becomes almost the same as the full charge capacity. If the remaining battery level is higher than or equal to the predetermined value (YES in step S623), the processing proceeds to step S624. If the remaining battery level is not higher than or equal to the predetermined value (NO in step S623), the processing proceeds to step S625.

In step S624, the control unit 110 displays an indication that the charging of the battery 102 is completed on the display unit 101. The processing proceeds to step S633.

In step S625, the control unit 110 performs remaining battery level conversion processing. The remaining battery level conversion processing is similar to that of FIG. 3C described above.

In step S626, the control unit 110 determines whether a condition that the battery 202 is not sufficiently charged is satisfied. For example, the control unit 110 determines whether SubBAT_ERR that is the remaining battery level error flag on the battery 202 is 1. If SubBAT_ERR is 1 (YES in step S626), the processing proceeds to step S627. If SubBAT_ERR is 0 (NO in step S626), the processing proceeds to step S628.

In step S627, the control unit 110 gives an error display indicating that the remaining battery level of the battery 202 is insufficient on the display unit 101. The processing proceeds to step S633.

In step S628, the control unit 110 charges the battery 102 with the power from the battery 202.

In step S629, the control unit 110 displays an indication that the battery 102 is being charged on the display unit 101.

FIGS. 7A to 7D illustrate display examples of the remaining battery levels of the batteries 102 and 202 in the case where the battery 102 is being charged with the power from the battery 202. The display modes of the remaining battery levels in the case where the battery 102 is being charged with the power from the battery 202 are different from those of the remaining battery levels in the foregoing case where the electronic apparatus 100 is powered by the battery 202.

Figure 7A:
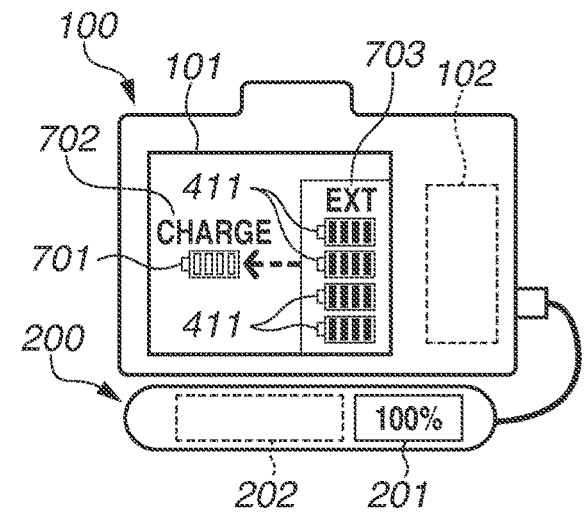
FIGS. 7A to 7D are diagrams illustrating examples of the display mode of respective remaining battery levels of batteries.

FIG. 7A illustrates a charging state where the battery 102 starts to be charged. The display unit 201 displays "100%", indicating that the remaining battery level of the battery 202 is equivalent to the full charge capacity of the battery 202.

The display unit 101 displays the remaining battery level of the battery 102 and the remaining battery level of the battery 202. For example, the display unit 101 displays a battery image 701 indicating the remaining battery level of the battery 102 and a "CHARGE" mark 702 indicating that the battery 102 is being charged with the power from the battery device 200. All the four blocks in the battery image 701 are white. The battery image 701 with only white blocks indicates that the battery 102 is dead.

The display unit 101 also displays four battery images 411 indicating the remaining battery level of the battery 202 and an "EXT" mark 703 indicating an external battery. The four battery images 411 illustrated in FIG. 7A are the same images as those illustrated in FIG. 5A described above. By visually observing the four battery images 411 illustrated in FIG. 7A, the user can find out that the remaining battery level of the battery 202 corresponds to four batteries 102.

Processing to be executed by the control unit 110 to display the four battery images 411 illustrated in FIG. 7A on the display unit 101 is similar to the processing for displaying the four battery images 411 illustrated in FIG. 4A described above. Displaying four aligned battery images 411 on the display unit 101 thus allows the user to find out that as many as four batteries 102 can be charged with the power from the battery 202.

Figure 7B:
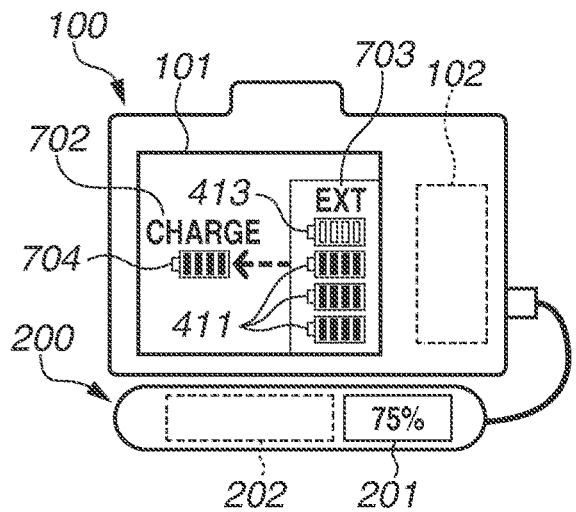

FIG. 7B illustrates a state where some time has passed from the charging state of FIG. 7A. The display unit 201 displays "75%", indicating that the remaining battery level of the battery 202 is 75% of the full charge capacity of the battery 202.

The display unit 101 displays a battery image 704 indicating the remaining battery level of the battery 102. All the four blocks in the battery image 704 are black. The battery image 704 with only black blocks indicates that the remaining battery level of the battery 102 is equivalent to the full charge capacity of the battery 102. By visually observing the battery image 704 illustrated in FIG. 7B, the user can find out that the battery 102 is fully charged.

The display unit 101 also displays three battery images 411 and one battery image 413 that indicate the remaining battery level of the battery 202. The three battery images 411 illustrated in FIG. 7B are the same images as those illustrated in FIG. 5A described above. The battery image 413 illustrated in FIG. 7B is the same image as those illustrated in FIG. 5B described above. By visually observing three battery images 411 and one battery image 413 as illustrated in FIG. 7B, the user can find out that the remaining battery level of the battery 202 corresponds to four minus one, i.e., three batteries 102.

Processing to be executed by the control unit 110 to display three battery images 411 and one battery image 413 in a line as illustrated in FIG. 7B on the display unit 101 is substantially the same as the processing for displaying the battery images 411 and 413 illustrated in FIG. 4F described above. In FIG. 4F, the number N is calculated to be 1. In FIG. 7B, the number N is calculated to be 3, and three battery images 411 are therefore displayed. Displaying three battery images 411 and one battery image 413 on the display unit 101 thus allows the user to find out that as many as three batteries 102 can be charged with the power from the battery 202.

Figure 7C:
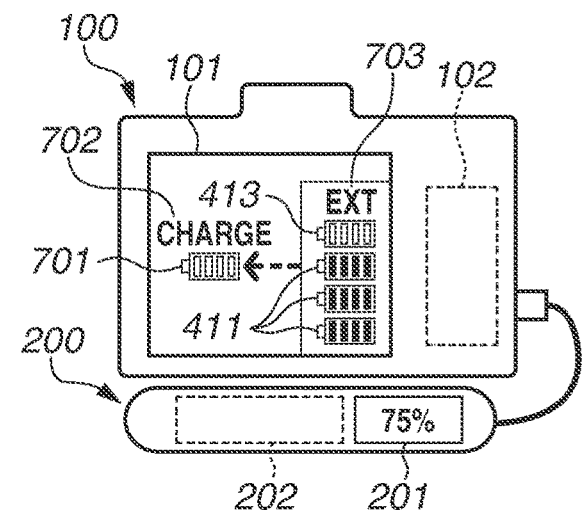

FIG. 7C illustrates a charging state where the battery 102 starts to be charged with the power from the battery device 200 again after use of the electronic apparatus 100 charged as illustrated in FIG. 7B. The display unit 201 displays "75%", indicating that the remaining battery level of the battery 202 is 75% of the full charge capacity of the battery 202.

The display unit 101 displays the battery image 701. The battery image 701 illustrated in FIG. 7C is the same image as that illustrated in FIG. 7A, and indicates that the battery 102 is dead. The display unit 101 also displays three battery images 411 and one battery image 413 that indicate the remaining battery level of the battery 202. By visually observing three battery images 411 and one battery image 413 as illustrated in FIG. 7C, the user can find out that the remaining battery level of the battery 202 corresponds to three batteries 102. The user can also find out that as many as three batteries 102 can be charged with the power from the battery 202.

Figure 7D:
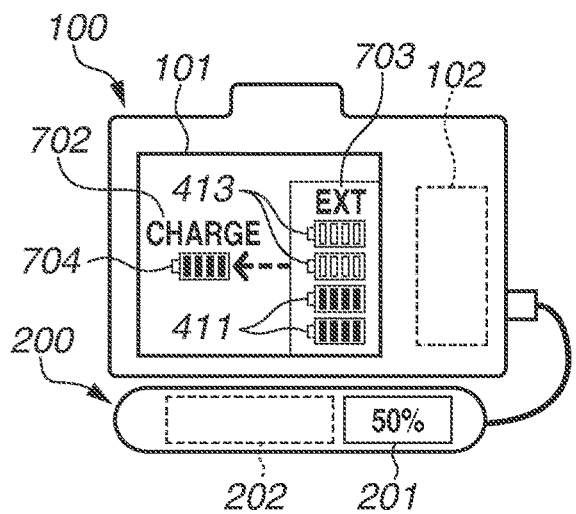

FIG. 7D illustrates a state where some time has passed from the charging state of FIG. 7C. The display unit 201 displays "50%", indicating that the remaining battery level of the battery 202 is 50% of the full charge capacity of the battery 202.

The display unit 101 displays the battery image 704 indicating the remaining battery level of the battery 102. The battery image 704 illustrated in FIG. 7D is the same image as that illustrated in FIG. 7B. By visually observing the battery image 704 illustrated in FIG. 7D, the user can find out that the battery 102 is fully charged.

The display unit 101 also displays two battery images 411 and two battery images 413 that indicate the remaining battery level of the battery 202. By visually observing two battery images 411 and two battery images 413 as illustrated in FIG. 7D, the user can find out that the remaining battery level of the battery 202 corresponds to two batteries 102.

Processing to be executed by the control unit 110 to display two battery images 411 and two battery images 413 as illustrated in FIG. 7D on the display unit 101 is substantially the same as the processing for displaying the battery images 411 and 413 illustrated in FIG. 4F described above. In FIG. 4F, the number N is calculated to be 1. In FIG. 7D, the number N is calculated to be 2, and two battery images 411 are therefore displayed. Displaying two battery images 411 and two battery images 413 in a line on the display unit 101 thus allows the user to find out that as many as two batteries 102 can be charged with the power from the battery 202.

After the processing of step S629 is ended, the processing proceeds to step S630.

In step S630, the control unit 110 performs connection check processing. This processing is similar to that of the foregoing flowchart of FIG. 3B for describing the connection check processing.

In step S631, the control unit 110 determines whether the battery device 200 is connected. For example, the control unit 110 checks whether the battery presence/absence flag EXT_BAT is 1. If EXT_BAT is 1 (YES in step S631), the processing proceeds to step S632. If EXT_BAT is 0 (NO in step S631), the processing proceeds to step S633.

In step S632, the control unit 110 determines whether the power of the electronic apparatus 100 is on from the state of the power switch 112. If the power is on (YES in step S632), the processing proceeds to step S633. If the power is not on (NO in step S632), the processing returns to step S622.

In step S633, the control unit 110 stops charging the battery 102 by the battery 202.

In step S634, the control unit 110 stores information indicating that charging is not in process in the storage unit 111. For example, the control unit 110 sets the charging state flag ChargeON to 0 and stores "0" as the value of ChargeON in the storage unit 111. The processing returns to step S601 of FIG. 6A.

As described above, according to the second exemplary embodiment, if the battery 102 is being charged with the power from the battery 202, the display unit 101 of the electronic apparatus 100 displays the information indicating the result obtained by calculating the remaining battery level of the battery 202 based on the full charge capacity of the battery 102. The user can thus find out how many batteries 102 the power supplied from the battery device 200 corresponds to. Since the display unit 101 also displays the remaining battery level of the battery 102 here, the user can find out the remaining battery level of the battery 102.

First Modification

In the foregoing first exemplary embodiment, the display unit 101 has been described to display four battery images 411 as illustrated in FIG. 5A if the remaining battery level of the battery 202 corresponds to four batteries 102. The display unit 101 has been also described to display the battery image 411 and the combination of the battery image 421 and "×3" as illustrated in FIG. 5E.

Figure 8A:
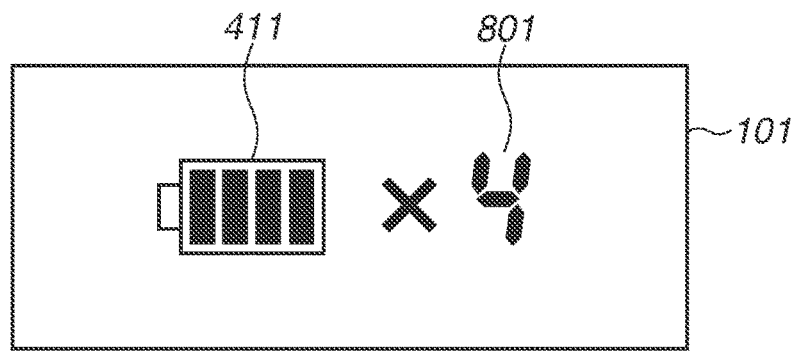
FIGS. 8A to 8D are diagrams illustrating modifications of the display mode of the remaining battery level of the battery.

A first modification of the first exemplary embodiment will be described with reference to FIG. 8A. As illustrated in FIG. 8A, the display unit 101 displays a battery image 411 and "×number" 801 in combination. According to the display example illustrated in FIG. 8A, the user can find out that as many as four batteries 102 can be charged, or that as much power as four batteries 102 can be supplied.

To implement the display example illustrated in FIG. 8A, in step S307 (or step S629), the control unit 110 displays the battery image 411 on the display unit 101. The control unit 110 also numerically displays the value substituted into I representing the integral part of the value N calculated in step S349 on the display unit 101. If the calculated value N includes a decimal part (value of D), the control unit 110 can round up or down the part after the decimal point to display only the integral part.

Second Modification

Figure 8B:
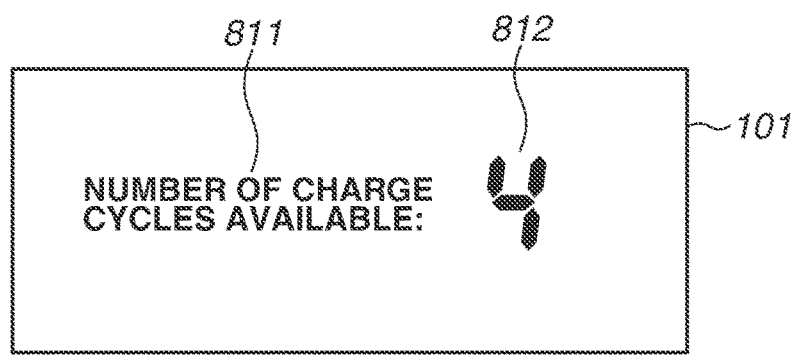

A second modification of the first exemplary embodiment will be described with reference to FIG. 8B. As illustrated in FIG. 8B, the display unit 101 displays characters 811 "NUMBER OF CHARGE CYCLES AVAILABLE:" and a numeral 812 in combination. According to the display example illustrated in FIG. 8B, the user can find out that four charge cycles are available.

To implement the display example illustrated in FIG. 8B, in step S307 (or step S629), the control unit 110 displays the characters 811 "NUMBER OF CHARGE CYCLES AVAILABLE:" on the display unit 101. The control unit 110 also numerically displays the value substituted into I representing the integral part of the number N calculated in step S349 on the display unit 101. If the calculated value N includes a decimal part (value of D), the control unit 110 may display the fractional part after the decimal point as well, or round up or down the fractional part after the decimal point to display only the integral part.

Third Modification

In the foregoing first exemplary embodiment, as illustrated in FIG. 5A, the description has been given of an example in which the battery images 411 are displayed with a plurality of blocks 412 arranged inside. However, such a display is not restrictive.

Figure 8C:
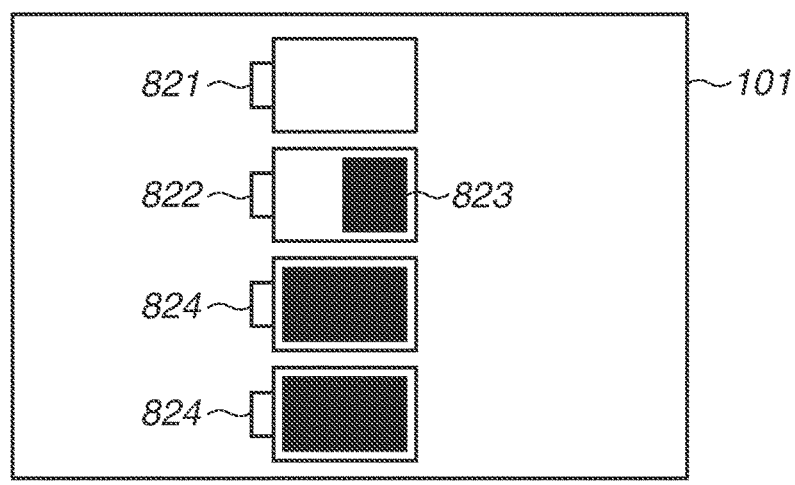

A third modification of the first exemplary embodiment will be described with reference to FIG. 8C. As illustrated in FIG. 8C, the display unit 101 displays battery images 821, 822, and 824 including no array of blocks inside. A battery image 821, a battery image 822, and two battery images 824 are displayed here. The battery image 821 is white inside. The battery image 821 illustrated in FIG. 8C replaces the battery images 413 illustrated in FIG. 5B. Each battery image 821 indicates that the remaining battery level of the battery 202 has decreased as much as one battery 102. The battery images 824 are black inside. The battery images 824 illustrated in FIG. 8C replace the battery images 411 illustrated in FIG. 5A. Each battery image 824 indicates a remaining battery level of the battery 202 corresponds to as much as one battery 102. The battery images 824 correspond to a predetermined image or second battery image, for example. The battery image 821 corresponds to a predetermined image or third battery image, for example. The two battery images 824 correspond to one group, and the single battery image 821 to another group.

The battery image 822 is partly black and partly white inside. The battery image 822 illustrated in FIG. 8C replaces the battery image 414 illustrated in FIG. 5C. The battery image 822 indicates that the larger a black occupied area 823 of the battery image 822 is, the higher the remaining battery level of the battery 202 is. The battery image 822 indicates a portion of the remaining battery level of the battery 202 less than one battery 102. The battery image 822 corresponds to a predetermined image or first battery image, for example. The display unit 101 displays the black occupied area 823 while changing its size continuously or in steps more than the number of blocks in the battery image 411. According to the display example illustrated in FIG. 8C, the user can find out the remaining battery level of the battery 202 by visually observing the size of the occupied area 823 in the battery image 822.

To implement the display example illustrated in FIG. 8C, in step S307 (or step S629), the control unit 110 displays two aligned battery images 824 based on the value of 2 substituted into I representing the integral part stored in the storage unit 111. The control unit 110 then determines the size of the black occupied area 823 in the battery image 822 based on the value substituted into D representing the decimal part stored in the storage unit 111. The greater the decimal part (the value of D), the larger black occupied area 823 the control unit 110 displays. The smaller the decimal part (the value of D), the smaller black occupied area 823 the control unit 110 displays. Based on a value of, e.g., 0.5 substituted into D representing the decimal part, the control unit 110 displays, on the display unit 101, a black occupied area 823 having a size substantially half of the entire area inside the battery image 822. Next, the control unit 110 displays the empty battery image 821 as the remaining one battery image.

Fourth Modification

In the foregoing first exemplary embodiment, the description has been given of an example in which the empty battery images 413 are displayed as illustrated in FIGS. 4F and 4G. However, such a display is not restrictive.

Figure 8D:
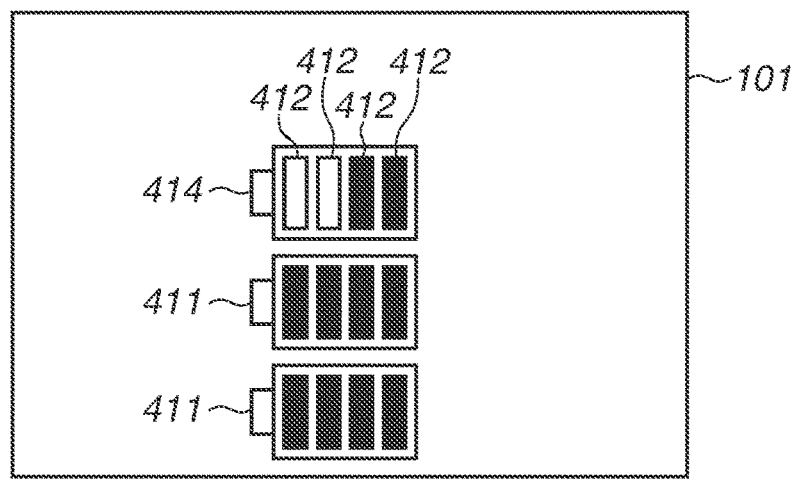

A fourth modification of the first exemplary embodiment will be described with reference to FIG. 8D. As illustrated in FIG. 8D, the display unit 101 presents the remaining battery level of the battery 202 by displaying two battery images 411 and one battery image 414 without an empty battery image 413.

To implement the display example illustrated in FIG. 8D, in step S307 (or step S629), the control unit 110 displays two aligned battery images 411 on the display unit 101 based on the value of 2 substituted into I representing the integral part stored in the storage unit 111. The control unit 110 then determines the number of black blocks among the blocks 412 of the battery image 414 based on the value substituted into D representing the decimal part, stored in the storage unit 111. Based on a value of, e.g., 0.5 substituted into D representing the decimal part stored in the storage unit 111, the control unit 110 displays the first and second blocks 412 from one end in black and the other blocks 412 in white. The control unit 110 does not display an empty battery image 413.

Part or all of the functions, processing, and methods described in the foregoing exemplary embodiments and modifications may be implemented by a personal computer, a microcomputer, or a central processing unit (CPU) executing a program. In a third exemplary embodiment, the personal computer, microcomputer, or CPU will be referred to as a "computer X". In the third exemplary embodiment, a program for controlling the computer X and implementing part or all of the functions, processing, and methods described in the foregoing exemplary embodiments and modifications will be referred to as a "program Y".

Part or all of the functions, processing, and methods described in the foregoing exemplary embodiments and modifications are implemented by the computer X executing the program Y. In such a case, the program Y is supplied to the computer X via a computer-readable storage medium. Examples of the computer-readable storage medium according to the third exemplary embodiment include at least one of the following: a hard disk drive, a magnetic recording device, an optical recording device, a magneto-optic recording device, a memory card, a volatile memory, and a non-volatile memory. The computer-readable storage medium according to the third exemplary embodiment is a non-transitory storage medium.

Other Exemplary Embodiments

In the foregoing exemplary embodiments and modifications, being charged with electricity is indicated by black in the battery images, and not being charged with electricity is indicated by white in the battery images. However, this is not restrictive. Whether being charged or not can be indicated by colors other than black and white, or by different shapes or patterns, as long as the user can identify it.

In the foregoing exemplary embodiments and modifications, the battery device 200 has been described to be a device operating as a mobile battery. However, this is not restrictive. The battery device 200 may be a smartphone or a tablet terminal.

In the foregoing exemplary embodiments and modifications, the electronic apparatus 100 has been described to be an apparatus operating as a digital camera. However, this is not restrictive. The electronic apparatus 100 may be a smartphone or a tablet terminal.

In the foregoing exemplary embodiment and modifications, the electronic apparatus 100 and the battery device 200 have been described to be connected to each other in a wired manner. However, this is not restrictive. The battery device 200 may be configured to wirelessly supply power to the electronic apparatus 100.

While aspects of the disclosure are described with reference to exemplary embodiments, it is to be understood that the aspects of the disclosure are not limited to the exemplary embodiments. The scope of the following claims is to be accorded the broadest interpretation so as to encompass all such modifications and equivalent structures.

This application claims the benefit of Japanese Patent Application No. 2020-007618, filed Jan. 21, 2020, which is hereby incorporated by reference herein in its entirety.

What is claimed is:

1. An electronic apparatus using a battery of the electronic apparatus as a power source of the electronic apparatus, the electronic apparatus comprising:
   a connector to which an external battery device is connected;
   a display;
   a CPU; and
   a memory storing a program which, when executed by the CPU, causes the CPU to function as:
   an obtaining unit configured to obtain information about a remaining battery level of a battery of the external battery device;
   a calculation unit configured to perform a calculation relating to the remaining battery level of the battery of the external battery device based on a full charge capacity of the battery of the electronic apparatus and the information about the remaining amount of the battery of the external battery device; and
   a control unit configured to perform a process to display information indicating a result of calculation made by the calculation unit on the display.

2. The electronic apparatus according to claim 1, wherein the control unit performs a process for charging the battery of the electronic apparatus with power supplied from the external battery device, and wherein the control unit is configured to display the information indicating the result of the calculation made by the calculation unit in a case where the battery of the electronic apparatus is being charged.

3. The electronic apparatus according to claim 1, wherein the control unit is configured to perform the process to display the information indicating the result of the calculation made by the calculation unit on the display in response to connection of the external battery device to the connector.

4. The electronic apparatus according to claim 1, wherein the control unit is configured to, in a case where the external battery device is connected to the connector, perform the process to display the information indicating the result of the calculation made by the calculation unit on the display, and in a case where the external battery device is not connected to the connector, perform a process to display information indicating a remaining battery level of the battery of the electronic apparatus on the display.

5. The electronic apparatus according to claim 1, wherein the information indicating the result of the calculation made by the calculation unit is information indicating a number of batteries of the electronic apparatus the remaining battery level of the battery of the external battery device corresponds to.

6. A control method for controlling an electronic apparatus which uses a battery of the electronic apparatus as a power source of the electronic apparatus comprising:
  obtaining information about a remaining battery level of a battery of an external battery device in a case that the external battery device is connected to a connector of the electronic apparatus;
  performing a calculation by a calculation unit of the electronic apparatus a remaining battery level of the battery of the external a battery device connected to the connector of the electronic apparatus based on a full charge capacity of the battery of the electronic apparatus and the information about the remaining amount of the battery of the external battery device; and
  displaying information indicating a result of calculation made by the calculation unit on a display of the electronic apparatus.

7. The method according to claim 6, further comprising:
  charging the battery of the electronic apparatus with power supplied from the external battery device connected to the connector of the electronic apparatus,
  wherein the displaying displays the information indicating the result of the calculation made by the calculation unit is displayed in a case where the battery of the electronic apparatus is being charged.

8. The method according to claim 6, wherein the displaying displays the information indicating the result of the calculation made by the calculation unit in response to connection of the external battery device to the connector.

9. The method according to claim 6, wherein in a case where the external battery device is connected to the connector, the displaying displays the information indicating the result of the calculation made by the calculation unit, and in a case where the battery device is not connected to the connection unit, the displaying displays information indicating a remaining battery level of the battery of the electronic apparatus.

10. The method according to claim 6, wherein the information indicating the result of the calculation made by the calculation unit is information indicating a number of batteries of the electronic apparatus the remaining battery level of the battery of the external battery device corresponds to.

11. A non-transitory storage medium that stores a program for causing a computer in an electronic apparatus to execute a method, the electronic apparatus using a battery of the electronic apparatus as a power source of the electronic apparatus and comprising a connector to which an external battery device is connected, and the method comprising:
  obtaining information about a remaining battery level of a battery of the external battery device
  performing a calculation relating to the remaining battery level of the battery of the external battery device based on a full charge capacity of the battery of the electronic apparatus and the information about the remaining amount of the battery of the external battery device; and
  performing a process to display information indicating a result of calculation made by the calculation unit on a display of the electronic apparatus.

12. The electronic apparatus according to claim 1, wherein the control unit performs a process for charging the battery of the electronic apparatus with power supplied from the external battery device in a case where the external battery device is connected to the connector.

13. The electronic apparatus according to claim 1, wherein the control unit performs a process to display information indicating a number of full charge cycles of the battery of the electronic apparatus available in accordance with the result of calculation made by the calculation unit on the display.

14. The electronic apparatus according to claim 1, wherein the control unit performs an image capturing process in accordance with an image capturing instruction from a user.

15. The method according to claim 6, wherein further comprising:
  charging the battery of the electronic apparatus with power supplied from the external battery device in a case where the external battery device is connected to the connector.

16. The method according to claim 6, wherein the displaying displays information indicating a number of full charge cycles of the battery of the electronic apparatus available in accordance with the result of calculation made by the calculation unit.

17. The method according to claim 6, wherein further comprising:
  performing an image capturing process in accordance with an image capturing instruction from a user.

* * * * *